United States Patent
Ouyahia et al.

(10) Patent No.: US 12,483,208 B2
(45) Date of Patent: Nov. 25, 2025

(54) RADIO FREQUENCY POWER AMPLIFIER

(71) Applicant: STMicroelectronics France, Montrouge (FR)

(72) Inventors: Samia Ouyahia, Vernouillet (FR); Renaud Lemoine, Champigny sur Marne (FR); Eric Wilhelm, Gisors (FR)

(73) Assignee: STMICROELECTRONICS France, Montrouge (FR)

( * ) Notice: Subject to any disclaimer, the term of this patent is extended or adjusted under 35 U.S.C. 154(b) by 786 days.

(21) Appl. No.: 17/662,542

(22) Filed: May 9, 2022

(65) Prior Publication Data
US 2022/0360236 A1  Nov. 10, 2022

(30) Foreign Application Priority Data
May 10, 2021  (FR) ...................... 2104917

(51) Int. Cl.
| | |
|---|---|
| H03F 1/22 | (2006.01) |
| H03F 1/02 | (2006.01) |
| H03F 3/213 | (2006.01) |
| H03F 3/45 | (2006.01) |
| H10D 84/80 | (2025.01) |

(52) U.S. Cl.
CPC ........... *H03F 3/213* (2013.01); *H03F 1/0216* (2013.01); *H03F 3/45179* (2013.01); *H10D 84/811* (2025.01); *H03F 2200/451* (2013.01)

(58) Field of Classification Search
CPC ....................................................... H03F 1/22
USPC .................................................. 330/311, 310
See application file for complete search history.

(56) References Cited

U.S. PATENT DOCUMENTS

| | | | |
|---|---|---|---|
| 10,886,911 B2 * | 1/2021 | Willard | ................ H10D 86/201 |
| 2013/0315348 A1 * | 11/2013 | Tasic | ................... H04L 27/2647 |
| | | | 375/340 |
| 2016/0126906 A1 | 5/2016 | Maxim et al. | |
| 2020/0162041 A1 | 5/2020 | Liang et al. | |

FOREIGN PATENT DOCUMENTS

| | | |
|---|---|---|
| KR | 20100024179 A | 3/2010 |
| WO | 2018052460 A1 | 3/2018 |

OTHER PUBLICATIONS

Zencir, Ertan et al., "A Low-power 435-MHz SOI CMOS LNA and Mixer", IFTU-30, IEEE MTT-S International Microwave Symposium Digest, New York, Jun. 8, 2003, 4 pages.

* cited by examiner

*Primary Examiner* — Henry Choe
(74) *Attorney, Agent, or Firm* — Slater Matsil, LLP

(57) ABSTRACT

According to an embodiment, An integrated circuit comprising a first cascode radio frequency (RF) power amplifier that includes a first common source transistor having a gate configured to receive a first RF signal, and a source connected to a neutral point; a first common gate transistor having a gate and a drain connected to a power source node, and a source connected to a drain of the first common source transistor; and a first resistor coupled between a bulk of the first common gate transistor and a first bulk bias node configured to provide a voltage that is greater than or equal to a voltage at the source of the first common gate transistor, wherein the first resistor is configured to obtain a floating point.

20 Claims, 3 Drawing Sheets

RADIO FREQUENCY POWER AMPLIFIER

CROSS-REFERENCE TO RELATED APPLICATIONS

This application claims the benefit of French Patent Application No. 2104917, filed on May 10, 2021, which application is hereby incorporated herein by reference.

TECHNICAL FIELD

Embodiments relate to radio frequency power amplifiers.

BACKGROUND

A radio frequency power amplifier is a type of electronic amplifier that converts a low-power radio frequency signal into a higher-power signal. Generally, radio frequency power amplifiers are coupled to the radio antenna of a transmitter.

The performance of a radio frequency power amplifier depends in particular on a gain, linearity and power-added efficiency (PAE) of this power amplifier.

A cascode arrangement can be used as a radio frequency power amplifier. A cascode arrangement comprises a plurality of field-effect transistors, in particular MOSFETs (Metal Oxide Semiconductor Field-Effect Transistor). These transistors are arranged in a cascode arrangement that is well known to a person skilled in the art.

In particular, a cascode arrangement can comprise a common source transistor and a common gate transistor. The common source transistor comprises a gate configured to receive a radio frequency signal. The common source transistor further comprises a source connected to a ground. The common gate transistor has a source connected to a drain of the common source transistor. The common gate transistor has a gate connected to a power source. The common gate transistor further comprises a drain connected to an output of the radio frequency power amplifier. The drain of the common gate transistor can also be connected to the power source.

The performance of such a radio frequency power amplifier may depend on the drain-to-source voltage of the common source transistor. In particular, the higher the drain-to-source voltage of the common source transistor, the better the performance of the radio frequency power amplifier.

In some applications, in particular in the Internet of Things, low-voltage power sources are used to limit the power consumption of the radio frequency power amplifier. More specifically, in these applications, the power source can be a relatively low-voltage battery. Some MOS cascode arrangements are thus configured such that they operate with a low supply voltage. In particular, the common gate transistor of such a cascode generally comprises a bulk connected to a neutral point, in particular to a ground.

However, a low-voltage MOS cascode radio frequency power amplifier generally limits the voltage at a common node between the common gate transistor and the common source transistor. Thus, at a low voltage, such a cascode arrangement has a low drain-to-source voltage of the common source transistor. This implies a limitation on the gain, linearity and power-added efficiency of the radio frequency power amplifier.

One solution for improving the performance of the radio frequency power amplifier involves using a bootstrap circuit to increase the gate voltage of the common gate transistor so as to increase the drain-to-source voltage of the common source transistor. Such a solution requires a complex and large circuit. Another solution involves increasing the size of the common gate transistor. However, such a transistor is thus large in size.

It is thus advisable to propose a simple and inexpensive solution to improve the performance of such a radio frequency power amplifier and that is small in size.

SUMMARY

According to one aspect, the invention proposes an integrated circuit comprising a radio frequency power amplifier including at least one cascode arrangement (hereinafter referred to simply by the term "cascode") comprising: a common source transistor having a gate configured to receive a radio frequency signal and a source connected to a neutral point (in particular to a ground), at least one common gate transistor having: a gate and a drain connected to a power source, a source connected to a drain of the common source transistor, and a bulk connected to a resistor configured to receive a voltage that is greater than or equal to a voltage at the source of the at least one common gate transistor, the resistor also being configured to obtain a floating point.

Applying a voltage that is greater than or equal to the source voltage of the at least one gate transistor allows a zero or negative source-to-bulk voltage to be imposed on the at least one common gate transistor.

This allows a threshold voltage of the at least one common gate transistor to be decreased compared to a similar cascode comprising a common gate transistor whose bulk is connected to a neutral point.

Decreasing the threshold voltage of the at least one common gate transistor allows the voltage between the at least one common gate transistor and the common source transistor to be increased. This increases the drain-to-source voltage of the common source transistor.

Increasing the drain-to-source voltage of the common source transistor allows the gain, linearity and power-added efficiency of the radio frequency power amplifier to be increased.

Moreover, such a power amplifier takes up little space in the integrated circuit. Advantageously, the resistor has a value that is greater than or equal to 10 kΩ. Preferably, the common source transistor has a bulk connected to the neutral point. Thus, the bulk of the common source transistor is isolated from the bulk of the common gate transistor.

In one advantageous embodiment, the bulk of the at least one common gate transistor is connected to the source of the at least one common gate transistor via a resistor configured to obtain a floating point.

In this way, such a cascode allows a zero source-to-bulk voltage to be imposed on the at least one common gate transistor. This reduces the threshold voltage of the at least one common gate transistor.

In one advantageous embodiment, the at least one cascode comprises a single common gate transistor. Alternatively, the at least one cascode comprises a plurality of common gate transistors.

In the latter embodiment, each common gate transistor can have a bulk connected to the source of the same common gate transistor. Thus, the bulks of the different common gate transistors are isolated from one another.

The use of a plurality of common gate transistors allows common gate transistors with a relatively low breakdown voltage to be used. For example, the breakdown voltage of the common gate transistors can be less than or equal to 5 Volts. The common source transistor can have a breakdown voltage of less than or equal to 2 Volts.

A higher drain-to-source voltage improves the amplification capacity of the cascode. It goes without saying that, in order to increase the power output of the cascode, the drain-to-source voltage of the transistors of the cascode should be increased.

In one embodiment, the radio frequency power amplifier includes two cascodes, each comprising: a common source transistor having a gate configured to receive a radio frequency signal and a source connected to a neutral point, at least one common gate transistor having: a gate and a drain connected to a power source, a source connected to a drain of the common source transistor of this cascode, and a bulk connected to a resistor configured to receive a voltage that is greater than or equal to a voltage at the source of the at least one common gate transistor, the resistor also being configured to obtain a floating point. The signals received by the gates of the common source transistors of the two cascodes are thus 180° out of phase with one another. Such an amplifier may operate as a differential amplifier.

BRIEF DESCRIPTION OF THE DRAWINGS

Other advantages and features of the invention will become apparent upon examining the detailed description of non-limiting embodiments and implementations of the invention, and from the accompanying drawings in which.

DETAILED DESCRIPTION OF ILLUSTRATIVE EMBODIMENTS

Figure 1:
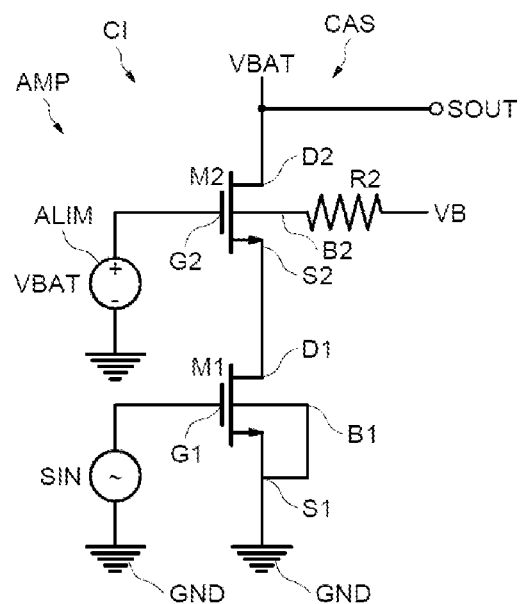
FIG. 1 illustrates an integrated circuit comprising a radio frequency power amplifier according to a first embodiment.

FIG. 1 shows an integrated circuit CI comprising a radio frequency power amplifier AMP according to a first embodiment.

The amplifier AMP comprises a cascode CAS configured to receive a radio frequency signal SIN at its input and to output an amplified signal SOUT based on this radio frequency signal. The cascode CAS includes two MOSFET transistors.

A first transistor M1 is a common source transistor and the second transistor M2 is a common gate transistor. In particular, the common source transistor M1 has a gate G1 configured to receive the radio frequency signal SIN to be amplified.

The common source transistor M1 further has a source S1 connected to a neutral point, for example to a ground GND. The common source transistor further has a drain D1 connected to the common gate transistor M2. The common source transistor M1 further has a bulk B1 connected to the neutral point, for example to the ground GND.

The common gate transistor M2 comprises a gate G2 and a drain D2 both connected to a power source ALIM, configured to supply a voltage VBAT. The drain D2 is furthermore connected to the output of the cascode CAS so as to output the amplified signal SOUT. In some applications, voltage VBAT may be provided by a battery, such as a battery having a relatively low voltage. For example, in some embodiments the battery voltage may have a nominal voltage of about 1.2 V. Alternatively, the battery voltage may be greater or less than 1.2 V depending on the particular embodiment and its specifications.

The common gate transistor M2 further comprises a source S2 connected to the drain D1 of the common source transistor M1. The common gate transistor M2 has a bulk B2 connected to a first terminal of a resistor R2. This resistor R2 has a second terminal configured to receive a voltage VB that is greater than or equal to a voltage at the source S2 of the common gate transistor M2. The voltage VB can be a voltage generated from the power source ALIM.

The resistor R2 is furthermore configured to obtain a floating point. For this purpose, the resistor R2 has a high value, in particular greater than 10 kΩ, for example comprised between 10 kΩ and 100 kΩ, in particular in the order of 10 kΩ.

Applying a voltage that is greater than or equal to the voltage at the source S2 of the common gate transistor M2 allows a zero or negative source-to-bulk voltage VSB to be imposed on the common gate transistor M2. This allows a threshold voltage $V_T$ of the common gate transistor M2 to be decreased compared to a similar cascode comprising a common gate transistor M2 whose bulk is connected to a neutral point.

Decreasing the threshold voltage $V_T$ of the common gate transistor M2 allows the voltage between the common gate transistor M2 and the common source transistor M1 to be increased. This increases the drain-to-source voltage $V_{DS}$ of the common source transistor M1. Increasing the drain-to-source voltage $V_{DS}$ of the common source transistor M1 allows the gain, linearity and power-added efficiency of the power amplifier to be increased.

In particular, the voltage at the source S2 of the common gate transistor M2 is equal to the difference between the voltage VBAT supplied by the power source ALIM and the gate-to-source voltage $V_{GS}$ of the common gate transistor M2. The gate-to-source voltage $V_{GS}$ of the common gate transistor M2 depends on a current $I_D$ flowing through the common gate transistor M2.

This current $I_D$ depends on the threshold voltage $V_T$ of the common gate transistor M2. This threshold voltage is defined according to the following formula, which is well known to a person skilled in the art:

$$V_T = V_{TO} + \gamma(\sqrt{2\phi_f + V_{SB}} - \sqrt{2\phi_f})$$

where $V_{SB}$ is the source-to-bulk voltage, $2\phi_f$ is a surface potential, and $V_{TO}$ is a threshold voltage for a zero substrate bias, $\gamma = (t_{ox}/\varepsilon_{ox})\sqrt{2q\varepsilon_{Si}N_A}$ where $t_{ox}$ is an oxide thickness, $\varepsilon_{ox}$ is an oxide permittivity, $\varepsilon_{Si}$ is a silicon permittivity, $N_A$ is a doping concentration, and q is the elementary charge.

Thus, the threshold voltage $V_T$ depends on the source-to-bulk voltage $V_{SB}$ of the common gate transistor M2. In particular, by applying the voltage VB to the second terminal of the resistor R2 connected to the bulk B2, a zero or negative source-to-bulk voltage $V_{SB}$ can be obtained. This reduces the threshold voltage $V_T$.

Reducing the threshold voltage $V_T$ further lowers the gate-to-source voltage $V_{GS}$ of the common gate transistor M2. However, the voltage on the gate G2 of the common gate transistor M2 is imposed by the power source ALIM. Thus, as the gate-to-source voltage $V_{GS}$ decreases and the voltage on the gate G2 is fixed, the voltage at the source S2 of the common gate transistor M2 increases. This increases the drain-to-source voltage $V_{DS}$ of the common source transistor M1. Integrated circuit CI may be a single monolithic integrated circuit having a single semiconductor substrate, such as a silicon substrate or a substrate made of another type of semiconductor material known in the art.

Figure 2:
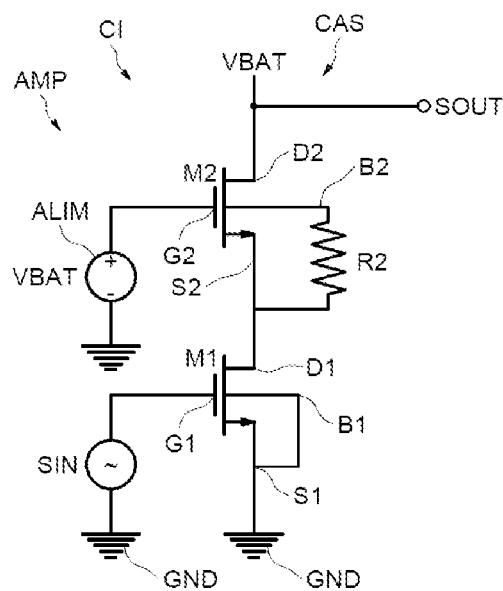
FIG. 2 illustrates an integrated circuit comprising a power amplifier according to a second embodiment.

FIG. 2 shows an integrated circuit CI comprising a power amplifier according to a second embodiment. The amplifier comprises a cascode CAS including a common source transistor M1 and a common gate transistor M2.

The cascode CAS differs from that in FIG. 1 in that the bulk B2 of the common gate transistor M2 and the source S2 thereof are connected via this resistor R2. Thus, the resistor R2 has a first terminal connected to the bulk B2 of the common gate transistor M2 and a second terminal connected to the source S2 of this common gate transistor M2.

Figure 3:
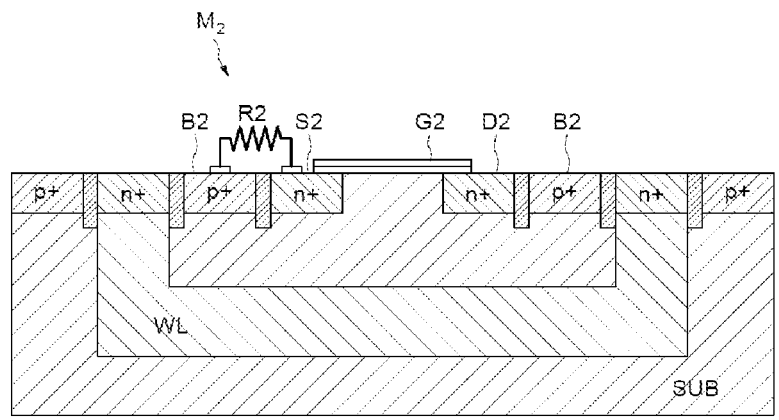
FIG. 3 illustrates a sectional view of a common gate transistor.

FIG. 3 shows a sectional view of such a common gate transistor M2. As seen hereinabove, the transistor M2 comprises a gate G2, a source S2, a drain D2 and a bulk B2. For example, the source S2 and the drain D2 are N-doped and the bulk B2 is P-doped. The gate transistor is formed in a P-doped substrate SUB and isolated therefrom by an N-doped layer WL. The resistor can be made of a polycrystalline silicon layer not shown.

Figure 4:
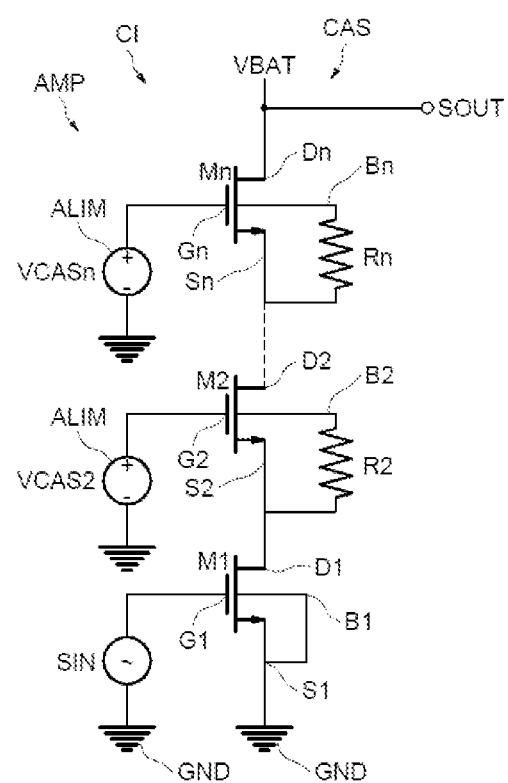
FIG. 4 illustrates a power amplifier according to a further embodiment.

In the embodiments shown in FIGS. 1 and 2, the cascode CAS comprises a single common gate transistor M2. However, a cascode CAS including a plurality of common gate transistors M2 can also be provided. Thus, in the embodiment shown in FIG. 4, the cascode CAS includes a plurality of common gate transistors M2 to Mn.

Each common gate transistor M2 to Mn respectively has a drain D2 to Dn connected to the source of the next common gate transistor. The last common gate transistor Mn has a drain connected to the output of the cascode and to the power source ALIM so as to receive a voltage VBAT. Each common gate transistor M2 to Mn further has a gate G2 to Gn connected to a power source ALIM for supplying a voltage VCAS2 to VCASn.

In the embodiment shown, each common gate transistor M2 to Mn respectively has a bulk B2 to Bn connected to the source S2 to Sn thereof via a resistor R2 to Rn. Each resistor R2 to Rn is configured to obtain a floating point.

Alternatively, each common gate transistor M2 to Mn respectively has a bulk B2 to Bn connected to a resistor R2 to Rn, this resistor being configured to receive a voltage that is greater than or equal to the voltage at the source S2, . . . , Sn of this common gate transistor. For example, each common gate transistor M2 to Mn thus respectively has a bulk B2 to Bn connected to the source S2 to Sn thereof. Thus, the bulks B2 to Bn of the different common gate transistors M2 are isolated from one another.

The use of a plurality of common gate transistors M2 allows common gate transistors M2 with a relatively low breakdown voltage to be used. The common source transistor can have a breakdown voltage of less than or equal to 2 Volts. A low breakdown voltage improves the amplification capacity of the cascode CAS.

The power amplifiers AMP described hereinabove can be used in systems and applications related to the Internet of things. In particular, these power amplifiers AMP can be integrated into objects comprising a radio antenna connected to the output of the power amplifier AMP, in particular via switching circuits and filters.

Figure 5:
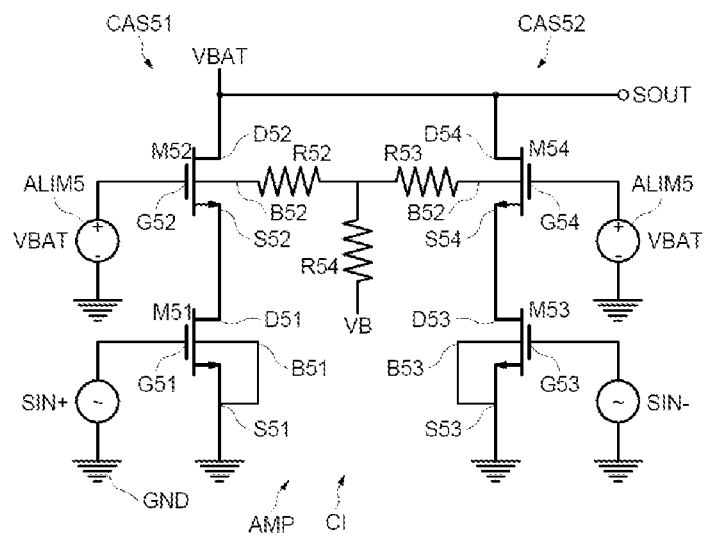
FIG. 5 illustrates an integrated circuit comprising a differential radio frequency power amplifier according to an embodiment.

FIG. 5 shows an integrated circuit CI comprising a differential radio frequency power amplifier according to a first embodiment. The amplifier AMP comprises a first cascode CAS51 configured to receive a first radio frequency signal SIN51 at its input. The amplifier AMP comprises a second cascode CAS52 configured to receive a second radio frequency signal SIN52 at its input. In an embodiment, the signals SIN51 and SIN52 are 180° out of phase with one another.

The cascode CAS51 includes two MOSFET transistors. A first transistor M51 is a common source transistor and the second transistor M52 is a common gate transistor. In particular, the common source transistor M51 has a gate G51 configured to receive the radio frequency signal SIN51 to be amplified. The common source transistor M51 further has a source S51 connected to a neutral point, for example to a ground GND. The common source transistor further has a drain D51 connected to the common gate transistor M52. The common source transistor M51 further has a bulk B51 connected to the neutral point, for example to the ground GND.

The common gate transistor M52 comprises a gate G52 and a drain D52 both connected to a power source ALIM5, configured to supply a voltage VBAT. The drain D52 is furthermore connected to the output of the cascode CAS51 so as to output the amplified signal SOUT. The common gate transistor M52 further comprises a source S52 connected to the drain D51 of the common source transistor M51. The common gate transistor M52 has a bulk B52 connected to a first terminal of a resistor R52. This resistor R52 has a second terminal connected to a first terminal of a resistor R54. This resistor R54 has a second terminal configured to receive a voltage VB that is greater than or equal to a voltage at the source S52 of the common gate transistor M52.

The voltage VB can be a voltage generated from the power source ALIM5.

The resistor R52 is furthermore configured to obtain a floating point. For this purpose, the resistor R52 has a high value, in particular greater than 10 kΩ, for example comprised between 10 kΩ and 100 kΩ, in particular in the order of 10 kΩ.

The cascode CAS52 includes two MOSFET transistors. A first transistor M53 is a common source transistor and the second transistor M54 is a common gate transistor. In particular, the common source transistor M53 has a gate G53 configured to receive the radio frequency signal SIN52 to be amplified. The common source transistor M53 further has a source S53 connected to a neutral point, for example to a ground GND. The common source transistor further has a drain D53 connected to the common gate transistor M54. The common source transistor M53 further has a bulk B53 connected to the neutral point, for example to the ground GND.

The common gate transistor M54 comprises a gate G54 and a drain D54 both connected to the power source ALIM5, configured to supply the voltage VBAT. The drain D54 is furthermore connected to the output of the cascode CAS52 so as to output the amplified signal SOUT. The common gate transistor M54 further comprises a source S54 connected to the drain D53 of the common source transistor M53. The common gate transistor M54 has a bulk B54 connected to a first terminal of a resistor R53. This resistor R53 has a second terminal connected to the first terminal of the resistor R54. The voltage VB is also greater than or equal to a voltage at the source S54 of the common gate transistor M54.

The resistor R53 is furthermore configured to obtain a floating point. For this purpose, the resistor R53 has a high value, in particular greater than 10 kΩ, for example comprised between 10 kΩ and 100 kΩ, in particular in the order of 10 kΩ.

Figure 6:
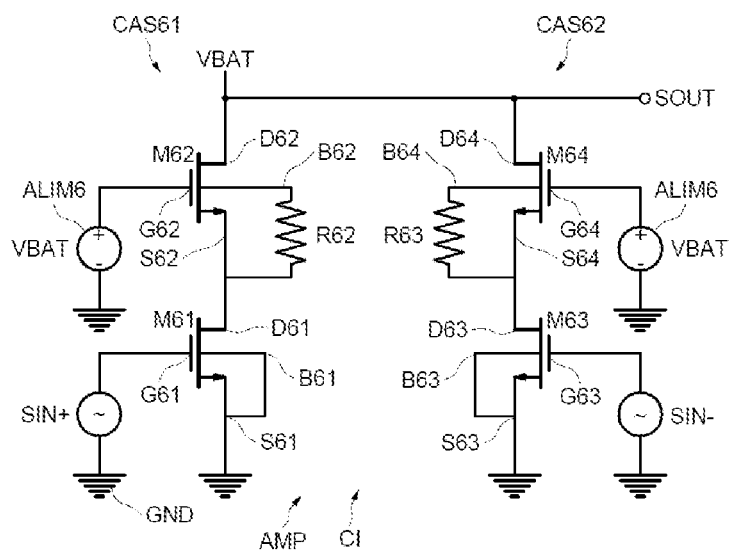
FIG. 6 illustrates an integrated circuit comprising a differential radio frequency power amplifier according to a further embodiment.

FIG. 6 shows an integrated circuit CI comprising a differential radio frequency power amplifier AMP according to one embodiment. The amplifier AMP comprises a first cascode CAS61 configured to receive a first radio frequency signal SIN61 at its input. The amplifier AMP comprises a second cascode CAS62 configured to receive a second radio frequency signal SIN62 at its input. The signals SIN61 and SIN62 are 180° out of phase with one another.

The cascode CAS61 includes two MOSFET transistors. A first transistor M61 is a common source transistor and the second transistor M62 is a common gate transistor. In particular, the common source transistor M61 has a gate G61 configured to receive the radio frequency signal SIN61 to be amplified.

The common source transistor M61 further has a source S61 connected to a neutral point, for example to a ground GND. The common source transistor further has a drain D61 connected to the common gate transistor M62. The common source transistor M61 further has a bulk B61 connected to the neutral point, for example to the ground GND.

The common gate transistor M62 comprises a gate G62 and a drain D62 both connected to a power source ALIM6, configured to supply a voltage VBAT. The drain D62 is furthermore connected to the output of the cascode CAS61 so as to output the amplified signal SOUT. The common gate transistor M62 further comprises a source S62 connected to the drain D61 of the common source transistor M61. The common gate transistor M62 has a bulk B62 connected to a first terminal of a resistor R62. This resistor R62 has a second terminal connected to the source S62 of the common gate transistor M62.

The voltage VB can be a voltage generated from the power source ALIM6.

The resistor R62 is furthermore configured to obtain a floating point. For this purpose, the resistor R62 has a high value, in particular greater than 10 kΩ, for example comprised between 10 kΩ and 100 kΩ, in particular in the order of 10 kΩ.

The cascode CAS62 includes two MOSFET transistors. A first transistor M63 is a common source transistor and a second transistor M64 is a common gate transistor. In particular, the common source transistor M63 has a gate G63 configured to receive the radio frequency signal SIN62 to be amplified. The common source transistor M63 further has a source S63 connected to a neutral point, for example to a ground GND. The common source transistor further has a drain D63 connected to the common gate transistor M64. The common source transistor M63 further has a bulk B63 connected to the neutral point, for example to the ground GND.

The common gate transistor M64 comprises a gate G64 and a drain D64 both connected to the power source ALIM6, configured to supply the voltage VBAT. The drain D64 is furthermore connected to the output of the cascode CAS62 so as to output the amplified signal SOUT. The common gate transistor M64 further comprises a source S64 connected to the drain D63 of the common source transistor M63.

The common gate transistor M64 has a bulk B64 connected to a first terminal of a resistor R63. This resistor R63 has a second terminal connected to the source S64 of the common gate transistor M64. The resistor R63 is furthermore configured to obtain a floating point. For this purpose, the resistor R63 has a high value, in particular greater than 10 kΩ, for example comprised between 10 kΩ and 100 kΩ, in particular in the order of 10 kΩ.

What is claimed is:

1. An integrated circuit comprising a first cascode radio frequency (RF) power amplifier comprising:
   a first common source transistor having a gate configured to receive a first RF signal, a source connected to a neutral point, and a bulk directly connected to the neutral point;
   a first common gate transistor having a gate and a drain connected to a power source node, and a source connected to a drain of the first common source transistor; and
   a first resistor coupled between a bulk of the first common gate transistor and a first bulk bias node configured to provide a voltage that is greater than or equal to a voltage at the source of the first common gate transistor, wherein the first resistor is configured to obtain a floating point.

2. The integrated circuit according to claim 1, wherein the bulk of the first common gate transistor is connected to the source of the first common gate transistor via the first resistor.

3. The integrated circuit according to claim 1, wherein the first common gate transistor comprises a single common gate transistor.

4. The integrated circuit according to claim 1, wherein the first common gate transistor comprises a plurality of common gate transistors.

5. The integrated circuit according to claim 1, further comprising a second cascode RF power amplifier, the second RF power amplifier comprising:
   a second common source transistor having a gate configured to receive a second RF signal 180° out of phase of from the first RF signal, and a source connected to the neutral point;
   a second common gate transistor having a gate and a drain connected to the power source node, and a source connected to a drain of the second common source transistor; and
   a second resistor coupled between a bulk of the second common gate transistor and a second bulk bias node configured to provide a voltage that is greater than or equal to a voltage at the source of the second common gate transistor, wherein the second resistor is configured to obtain a floating point.

6. The integrated circuit according to claim 1, wherein the first resistor has a resistance greater than or equal to 10 kΩ.

7. The integrated circuit according to claim 1, wherein the first resistor comprises a polycrystalline silicon layer formed on the integrated circuit.

8. The integrated circuit according to claim 1, wherein the first common gate transistor comprises:
   a P-doped bulk region forming the bulk of the first common gate transistor;
   N-doped regions forming the source and drain of the first common gate transistor; and
   a gate structure overlying a channel region between the source and drain of the first common gate transistor, wherein the first common gate transistor is formed in a P-doped substrate and is isolated from the P-doped substrate by an N-doped isolation layer, wherein the N-doped isolation layer forms a well surrounding the P-doped bulk region of the first common gate transistor.

9. The integrated circuit according to claim 8, wherein the first common source transistor comprises:
- a P-doped bulk region forming the bulk of the first common source transistor;
- N-doped regions forming the source and drain of the first common source transistor; and
- a gate structure overlying a channel region between the source and drain of the first common source transistor, wherein the P-doped bulk region of the first common source transistor is electrically connected to the neutral point.

10. The integrated circuit according to claim 1, wherein the first common gate transistor and the first common source transistor are formed in separate wells within the integrated circuit, the separate wells being electrically isolated from each other.

11. An integrated circuit comprising a radio frequency (RF) power amplifier comprising:
- a common source transistor having a gate configured to receive an RF signal, a source connected to a neutral point, and a bulk directly connected to the source and to the neutral point;
- a first common gate transistor having a gate connected to a first bias voltage source, a drain coupled to a power source node, and a source coupled to a drain of the common source transistor; and
- a first resistor coupled between a bulk of the first common gate transistor and a first bulk bias node, wherein the first bulk bias node is configured to provide a voltage that is greater than or equal to a voltage at the source of the first common gate transistor, wherein the first resistor is configured to obtain a floating point.

12. The integrated circuit according to claim 11, further comprising:
- a second common gate transistor having a gate connected to a second bias voltage source, a drain coupled to the power source node, and a source coupled to the drain of the first common gate transistor, the drain of the first common gate transistor being coupled to the power source node through a source of a second common gate transistor; and
- a second resistor coupled between a bulk of the second common gate transistor and a second bulk bias node, wherein the second resistor is configured to obtain a floating point, and the second bulk bias node is configured to provide a voltage that is greater than or equal to a voltage at the source of the second common gate transistor.

13. The integrated circuit according to claim 12, wherein the first bulk bias node is connected to the source of the first common gate transistor, and the second bulk bias node is connected to the source of the second common gate transistor.

14. The integrated circuit according to claim 12, wherein the first resistor and the second resistor each have a resistance greater than or equal to 10 k$\Omega$.

15. An integrated circuit comprising a first cascode radio frequency (RF) power amplifier comprising:
- a first common source transistor having a gate configured to receive a first RF signal, a source connected to a neutral point;
- a first common gate transistor having a gate and a drain connected to a power source node, and a source connected to a drain of the first common source transistor; and
- a first resistor coupled between a bulk of the first common gate transistor and a first bulk bias node configured to provide a voltage that is greater than or equal to a voltage at the source of the first common gate transistor, wherein the first resistor is configured to obtain a floating point, and wherein the bulk of the first common gate transistor is connected to the source of the first common gate transistor via the first resistor.

16. The integrated circuit according to claim 15, wherein the first common source transistor further comprises a bulk directly connected to the neutral point.

17. The integrated circuit according to claim 15, wherein the first common gate transistor consists of a single common gate transistor.

18. The integrated circuit according to claim 15, wherein the first common gate transistor comprises a plurality of common gate transistors.

19. The integrated circuit according to claim 15, wherein the first resistor has a resistance greater than or equal to 10 k$\Omega$.

20. The integrated circuit according to claim 15, wherein the first resistor comprises a polycrystalline silicon layer formed on the integrated circuit.

* * * * *